United States Patent [19]

Huber

[11] Patent Number: 5,020,030
[45] Date of Patent: May 28, 1991

[54] NONVOLATILE SNOS MEMORY CELL WITH INDUCED CAPACITOR

[76] Inventor: Robert J. Huber, 1145 E. Millbrook Way, Bountiful, Utah 84010

[21] Appl. No.: 265,409

[22] Filed: Oct. 31, 1988

[51] Int. Cl.$^5$ .............................................. G11C 7/00
[52] U.S. Cl. .................................. 365/185; 365/184; 365/228; 357/23.5
[58] Field of Search ............... 365/184, 185, 228, 218; 357/23.5

[56] References Cited

U.S. PATENT DOCUMENTS

| | | | |
|---|---|---|---|
| 4,471,472 | 9/1984 | Young | 365/200 |
| 4,608,585 | 8/1986 | Keshtbod | 357/23.5 |
| 4,615,020 | 9/1986 | Rinerson et al. | 365/184 |
| 4,616,340 | 10/1986 | Hayashi et al. | 365/185 |
| 4,618,541 | 10/1986 | Forouhi et al. | 428/688 |
| 4,630,086 | 12/1986 | Sato et al. | 357/23.5 |
| 4,649,520 | 3/1987 | Eitan | 365/185 |
| 4,654,825 | 3/1987 | Rinerson | 365/185 |
| 4,654,831 | 3/1987 | Venkatesh | 365/207 |
| 4,665,417 | 5/1987 | Lam | 357/23.5 |
| 4,665,426 | 5/1987 | Allen et al. | 357/54 |
| 4,672,409 | 6/1987 | Takei et al. | 357/23.5 X |
| 4,780,750 | 10/1988 | Nolan et al. | 365/185 |
| 4,794,562 | 12/1988 | Kato et al. | 365/185 |
| 4,813,018 | 3/1989 | Kobayashi et al. | 365/185 X |
| 4,823,175 | 4/1989 | Fontana | 365/185 |

FOREIGN PATENT DOCUMENTS 63-144578  6/1988  Japan .................................. 365/185

OTHER PUBLICATIONS

"XICOR" Data Book, Sep. 1987, pp. 8-6 to 8-10; 8 ∝ 48 to 8-49; 8 ∝ 109; and 8-117 to 8-120, Second Edition, First Printing.

Primary Examiner—A. J. Heinz
Assistant Examiner—Alfonso Garcia
Attorney, Agent, or Firm—Donald R. Greene

[57] ABSTRACT

A silicon substrate with a drain area formed therein is used for the base of the device. A first polysilicon gate is disposed above the substrate with a layer of gate oxide therebetween. Adjacent to the first gate and contiguous to the same plane is a second polysilicon gate. The second gate and the substrate are separated by a layer of tunnel oxide and silicon nitride. The silicon nitride being used to store a charge. The state of the device is determined by the presence of a capacitance in the substrate generated by the charge on the silicon nitride. This device may function as a nonvolatile memory or a dynamic random access memory with the capability of capturing its DRAM state.

19 Claims, 9 Drawing Sheets

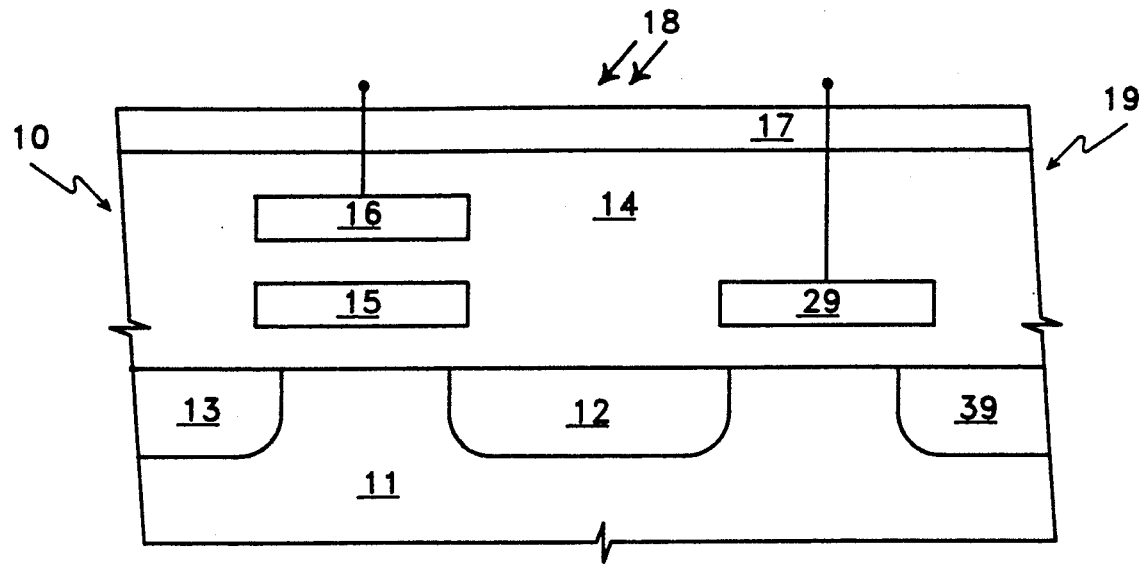
Fig. 1A —PRIOR ART—
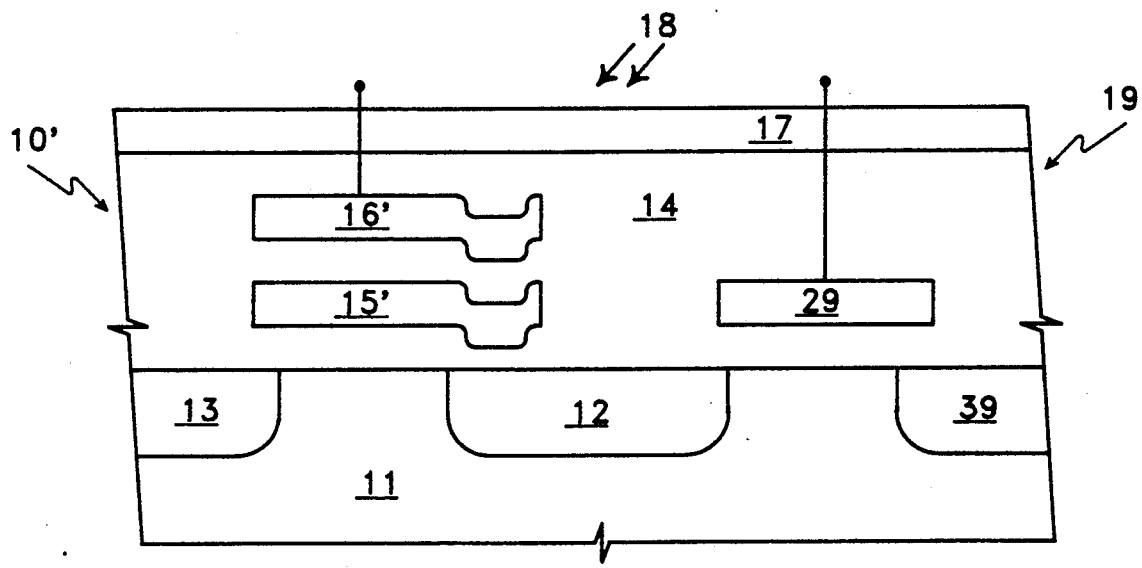
Fig. 1B —PRIOR ART—
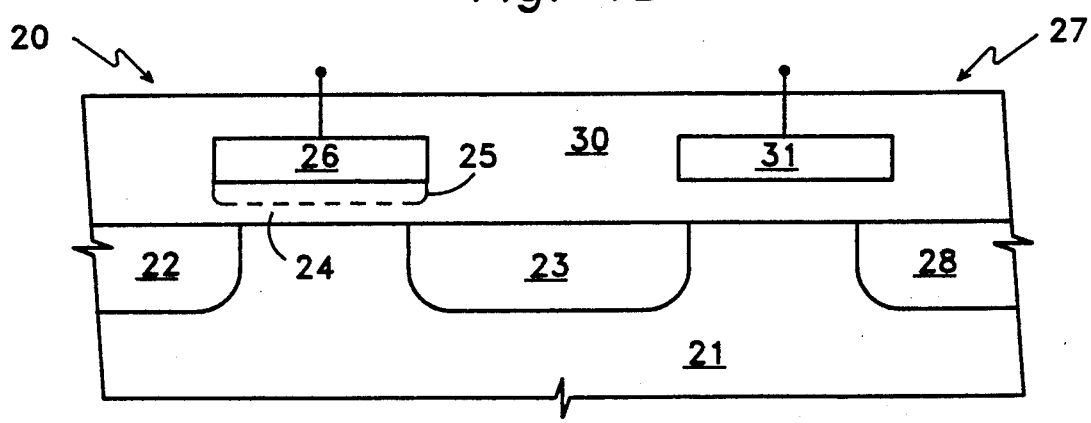
Fig. 2 —PRIOR ART—

NONVOLATILE SNOS MEMORY CELL WITH INDUCED CAPACITOR

BACKGROUND OF THE INVENTION

The present invention relates, in general, to semiconductor memory devices and, more particularly to nonvolatile semiconductor memory devices. These include devices often referred to in the industry as EPROMs (Erasable Programmable Read Only Memories) or EEPROMS (Electrically Erasable Programmable Read Only Memories).

Semiconductor memory devices are generally designed in an array of individual memory cells. Nonvolatile semiconductor memory cells generally consist (Metal Oxide Semiconductor) of a MOS transistor having a threshold voltage that can be electrically changed. There are two general, types of nonvolatile semiconductor memory cells, namely a floating gate type, having variations known as FLOTOX (FLOating gate Tunnel OXide) and textured polysilicon, and an SNOS (Silicon-Nitride-Oxide-Silicon) type having variations known as SONOS (Silicon-Oxide-Nitride-Oxide-Silicon) and MNOS (Metal-Nitride-Oxide-Silicon).

In the floating gate type of device, two gates are utilized, a floating gate and a control gate. The floating gate is disposed between and isolated from the control gate and a semiconductor substrate.

The memory state of the floating gate device is determined by the charge on the floating gate. In an n-channel device, an accumulation of electrons on the floating gate causes a high threshold voltage; whereas, a deficit of electrons (a net positive charge) causes a low (or possibly negative) threshold voltage. In its usual application, with the control gate at 0 volts, current will flow through the cell if the floating gate is uncharged or has a net positive charge (erased), which is a logic 1 state. Accordingly, current will not flow through the cell if the floating gate is sufficiently negatively charged (programmed), which is the logic 0 state.

Because the floating gate is a good electrical conductor, lateral charge transfer in the floating gate takes place easily. As a result, vertical charge transfer during programming need only take place in one localized area of the channel. However, this property makes the floating gate device more susceptible to defects in the insulator surrounding the floating gate.

These floating gate cells require both drain and source regions which make the area required for each cell relatively large. The large cells in turn limit the number of devices that can be placed in a given area. With nonvolatile memory sizes approaching the 1 million bit mark on a single die, any reduction in cell size is of great economic benefit.

The second type of nonvolatile memory device is that referred to as SNOS. The SNOS memory device consists of a single transistor which has a polysilicon gate disposed on a silicon nitride layer on top of a thin layer of oxide on a silicon substrate. A charge is stored in discrete traps in the bulk of the nitride layer. Because of the discrete nature of the traps, lateral charge transfer does not readily occur. Therefore, to adequately program the memory transistor, vertical charge transfer must occur over a large area of the channel region. This makes the SNOS memory cell less susceptible to defects in the oxide layer disposed over the channel.

In the erased state, current may flow through the memory transistor even if the control gate is held at 0 volts because the erased state threshold voltage may be negative. This current which flows through unaddressed, erased, cells can accumulate for a particular column resulting in a false "on" state being generated when a written memory cell is addressed. As a result of this false "on" current in an array, select transistors are required to operate the cells properly. These select transistors can substantially increase the area required to fabricate an array of cells.

Accordingly, it is an object of the present invention to provide a semiconductor memory device which overcomes the above deficiencies.

A further object of the present invention is to provide a semiconductor memory device that is nonvolatile.

Another object of the present invention is to provide a semiconductor memory device that requires less area.

Still another object of the present invention is to provide a semiconductor memory device that does not require a formed source area for the select transistor.

Yet another object of the present invention is to provide a semiconductor memory device that does not require formed source or drain areas for the nonvolatile memory structure.

Another object of the present invention is to provide a semiconductor memory device that operates with a single transistor, or single cell, providing both the memory and select functions.

Still another object of the present invention is to provide a semiconductor memory device that is capable of operating as a dynamic random access memory (DRAM) device.

Yet another object of the present invention is to provide a semiconductor memory device that will function as a shadow RAM or a random access memory device that has the ability to store its state in the event of a power outage or the like.

SUMMARY OF THE INVENTION

A preferred embodiment of the present invention consists of a semiconductor memory device having a silicon substrate with a drain region formed therein. A first polysilicon gate is disposed above the substrate with a layer of gate oxide therebetween. Adjacent to the first gate and disposed above the substrate is a second polysilicon gate. The second gate and the substrate are separated by layers of tunnel oxide and silicon nitride. Preferably, the second gate would be in the same plane and as close as possible to the first gate while still maintaining an isolation between the two gates. In actual practice, it may be necessary to have the second gate overlapping the first gate while maintaining the isolation between the two gates. Alternatively, the first gate may be stepped over the second gate while maintaining the isolation between the two gates.

BRIEF DESCRIPTION OF THE DRAWINGS

FIGS. 1A and 1B are cross-sectional views of prior art floating gate memory devices;

FIG. 2 is a cross-sectional view of a prior art SNOS type memory device;

DETAILED DESCRIPTION OF THE DRAWINGS

Figure 3:
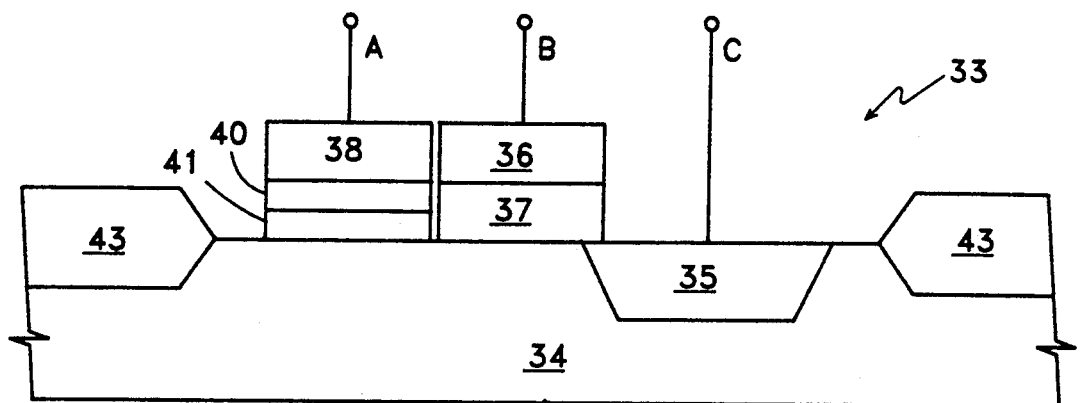
FIG. 3 is a cross-sectional view of an idealized preferred embodiment of a memory device according to the present invention.

Referring initially to FIG. 1A, a cross-sectional view of one embodiment of the prior art floating gate memory device often referred to as an EPROM, generally designated 10, is illustrated. Device 10 consists of a p-type substrate 11 having an n-type drain 12 and an n-type source 13 formed therein. Located above substrate 11 is a layer of oxide 14 having a pair of gates 15 and 16 disposed therein. Gate 15 is a polysilicon floating gate and gate 16 is usually a polysilicon control gate. A passivation layer, such as silicon nitride or silicon dioxide, 17 covers the device. The portion of the layer of oxide 14 located between floating gate 15 and substrate 11 is on the order of 200 Angstroms thick.

Referring to FIG. 1B, a cross-sectional view of a second embodiment of a prior art floating gate memory device, known as an EEPROM, generally designated 10', is illustrated. Device 10' is similar to device 10 with the difference being in the design of gates 15 and 16. As shown, a portion of gate 15' is disposed closer to drain 12. The leaves a very thin layer of oxide 14 between gate 15' and drain 12. This thin layer of oxide 14 makes possible the electrical erasing of device 10'. Gate 16' also has a similar design to maintain the distance between the gates.

In operation, if a sufficiently large positive voltage relative to drain 12 exists on floating gate 15, electrons will tunnel from drain 12 to floating gate 15 becoming trapped thereon. The presence or absence of excess electrons on floating gate 15 determines the logical state of the device. The large positive voltage may be applied to floating gate 15 by capacitive coupling from control gate 16.

In an n-channel device, an accumulation of electrons on the floating gate from the drain causes a high threshold voltage. A high current will flow through the cell to ground if the floating gate is uncharged (erased), which is the logic 1 state; and current will not flow, or possibly a very low current will flow, if the cell is charged (programmed), which is the logic 0 state. Examples of these types of cells can be found in U.S. Pat. Nos. 4,618,541 issued to Forouhi et al. and 4,665,426 issued to Allen et al. A current sensing amplifier associated with the cell provides a digital output corresponding to the flow of current through the cell to ground. An example of a current sensing amplifier can be found in U.S. Patent No. 4,654,831 issued to Bhimachar Venkatesh.

To erase a charged cell 10 of FIG. 1A the charge must be removed, or decreased, on floating gate 15. One way of accomplishing this charge reduction is to expose the floating gate to UV (UltraViolet) light represented by arrows 18. The impinging radiation excites the electrons trapped on floating gate 15 causing them to move off gate 15 to gate 16 or substrate 11.

These types of devices, while adequate for many applications, are inconvenient to erase in that the device must be removed from what ever system it resides and exposed under a UV light for an extended period of time. These devices also require that both source and drain regions be formed in the substrate which greatly effects the size of the memory cells.

Device 10' of FIG. 1B, may be erased if a sufficiently large negative voltage is applied between floating gate 15' and drain 12. Electrons will tunnel from gate 15' to drain 12 removing the trapped electrons from gate 15'. The negative voltage may be applied by capacitive coupling by holding control gate 16' at ground potential and driving drain 12 to a positive potential. Thin oxide 14 between gate 15' and drain 12 allows tunneling at practical voltages.

Each memory cell 10 also contains a select transistor 19 which is comprised of a gate 29, a drain 38, and utilizes region 12 as a source. Select transistor 19 is provided to prevent the flow of current through cell 10 when cell 10 is not addressed. Select transistor 19 will prevent the false "on" readings discussed above.

Referring now to FIG. 2, a prior art SNOS type of memory cell, generally designated 20 is illustrated. Cell 20 consists of a p-type substrate 21 having an n-type source region 22 and an n-type drain region 23 formed therein. Above substrate 21 and between source 22 and drain 23 is a thin layer of oxide 24, approximately 20 Angstroms thick. Above oxide 24 is an area of nitride 25 and above nitride 25 is a polysilicon control gate 26.

A charge is stored in discrete traps in nitride 25. Because of the discrete nature of the traps, charge transfer has to occur over a large channel region.

In the erased state, in which there are no excess electrons stored in nitride 25 or a deficit of electrons (a net positive charge) in nitride 25, current will flow through the memory transistor of cell 20. This current flow will occur even if control gate 26 is at ground. In an array of memory cells, such as any programmable read only memory device, all erased cells connected to a column will pass current to the column resulting in a false state indicator for the addressed cell. To prevent this false indicator, a select transistor 27 is provided with each cell 20.

Select transistor 27 is comprised of a select drain 28 and source 23, which is the same area as drain 23 of the memory cell. Located above substrate 21 in an oxide layer 30 and between drain 28 and source 23 is a polysilicon access gate 31.

Cell 20 is programmed by applying high voltage to gate 26 and can be erased by grounding gate 26 and taking substrate 21 to a high voltage. Again, a drawback of cells such as 20 is the area which they require. In addition to having both source 22 and drain 23 formed in substrate 21, room must be provided for an extra gate 31 and formed drain 28.

These types of cells also utilize sensing amplifiers as described above to determine the logical state of the cell.

Referring to FIG. 3, a cross-sectional view of a memory device, generally designated 33, embodying the present invention is illustrated. Memory device 33 consists of a substrate 34 of one conductive type having a drain 35 of opposite conductivity. For the present example, substrate 34 will be taken as a p-type substrate and drain 35 as an n-type drain.

Above substrate 34 and adjacent drain 35 is a polysilicon select gate 36. Select gate 36 is separated from substrate 34 by a gate oxide layer 37. Gate oxide layer 37 may be approximately 200–500 Angstroms thick.

Located adjacent to select gate 36 is a memory gate 38. While memory gate 38 is adjacent to select gate 36, the two gates remain isolated from each other. Below gate 38 is a charge retaining area 40. Charge retaining area 40 is preferably a silicon nitride layer approximately 50–500 Angstroms thick. Between area 40 and substrate 34 is tunnel oxide layer 41. Tunnel oxide layer 41 may be approximately 15–30 Angstroms thick with the ideal thickness being approximately 18 Angstroms. On either side of cell 33 are areas of field oxide 43.

In FIG. 3, an idealized embodiment of the present invention is illustrated. However, from a processing standpoint, it is impractical to process a cell 33 having gates 36 and 38 contiguous to the same plane at their adjacent edges, while insuring they remain isolated from each other. Therefore, as illustrated in FIGS. 4A and 4B, a cross-sectional area of alternative practical cell designs are illustrated.

Figure 4A:
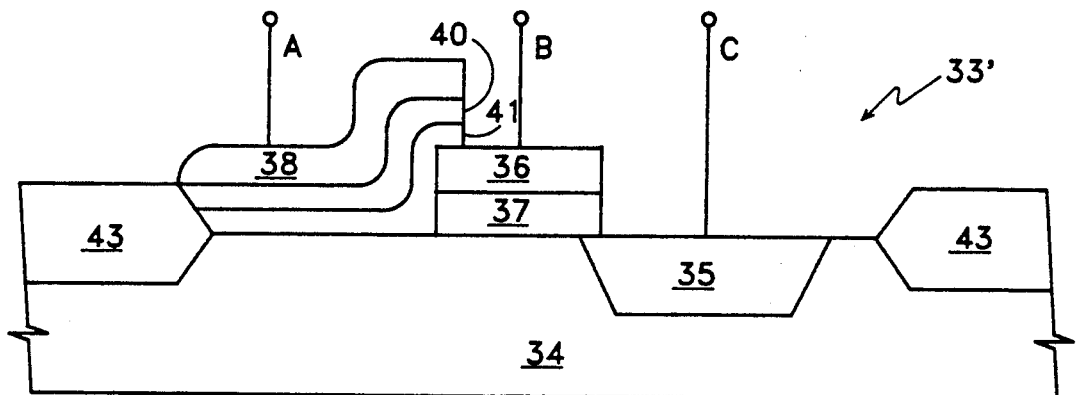
FIG. 4A is a cross-sectional view of a practical version of the preferred embodiment of the memory device of FIG. 3.
Figure 4B:
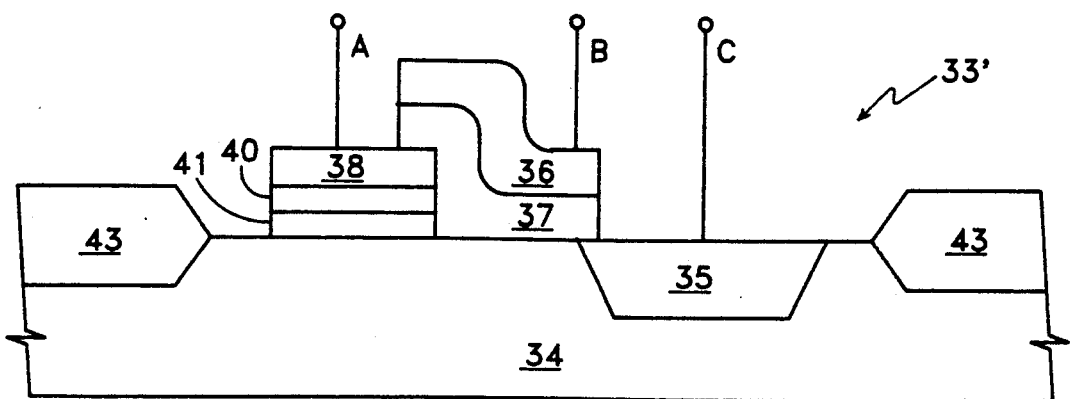
FIG. 4B is a cross-sectional view of an alternative practical version of the preferred embodiment of the memory device of FIG. 3.

A cell 33' is illustrated in FIG. 4A having the same elements as cell 33 in FIG. 3. The difference between cells 33 and 33' is that gate 38, nitride layer 40, and tunnel oxide 41 step up and to some extent overlay gate 36. Alternatively, as shown in FIG. 4B, gate 36 and oxide 37 may step up and to some extent overlay gate 38. The objective here is to enable the inversion layers, which may be formed in substrate 34 below gates 36 and 38, to make contact.

Figure 5:
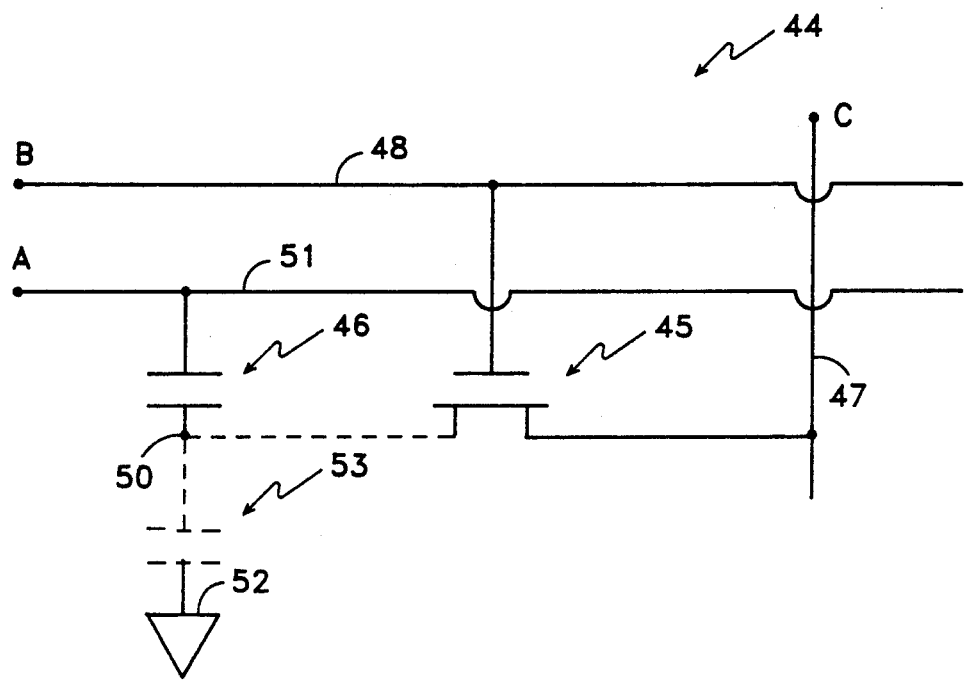
FIG. 5 is a schematic diagram of the equivalent circuit of the memory device of FIG. 3.

A schematic representation of an equivalent circuit, generally designated 44, of cell 33 is illustrated in FIG. 5. Circuit 44 consists of a transistor 45 and a capacitor 46. The drain of transistor 45 is drain 35, FIG. 3. The gate of transistor 45 is gate 36, FIG. 3. The source of transistor 45 is the inversion layer 56 (FIG. 6A) generated by gate 38, FIG. 3, if the inversion layer exists. If the inversion layer does not exist, transistor 45 has no source and there is no connection from node 50 to the source of transistor 45. Furthermore, if the inversion layer does not exist, capacitor 53 does not exist and node 50 is coupled to ground. Conditional capacitor 53 and the inversion layer exist depending on the charge in nitride 40, FIG. 3.

Figure 6A:
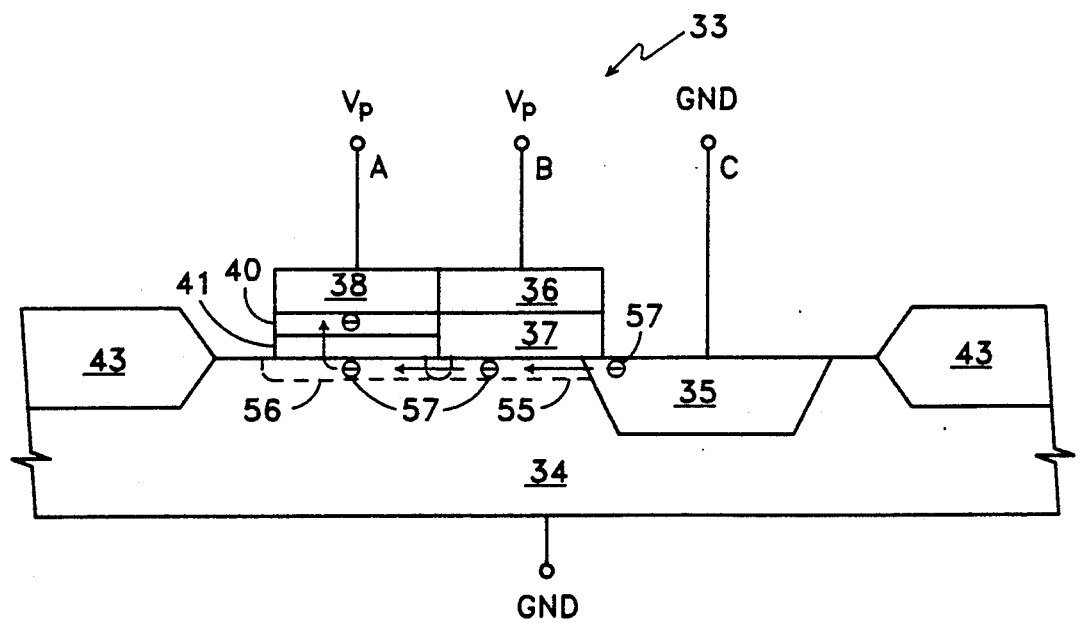
FIGS. 6A and 6B are cross-sectional views of the memory device of FIG. 3 illustrating a write operation.
Figure 6B:
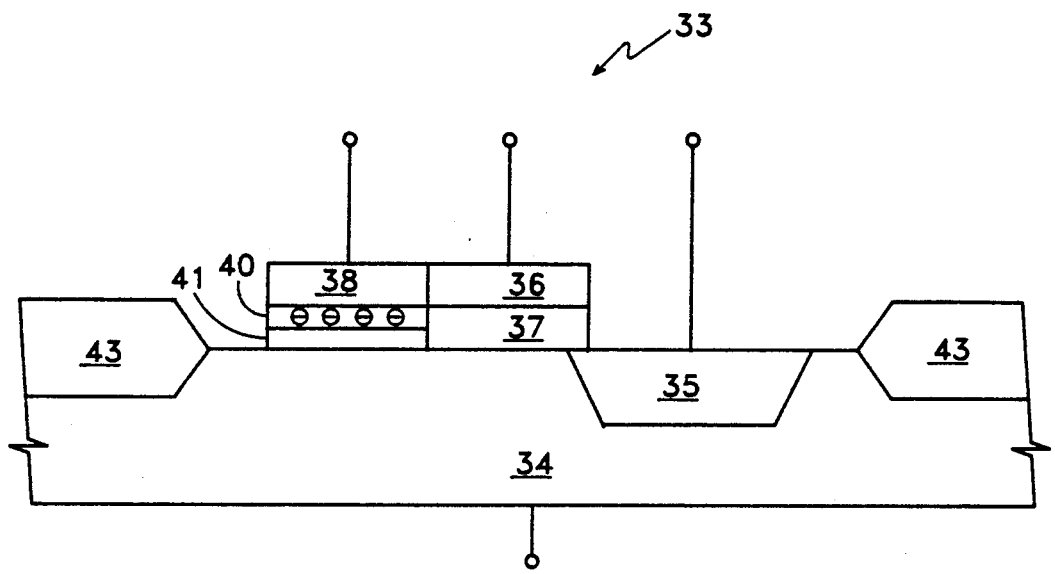

The writing operation of cell 33 is illustrated in FIGS. 6A and 6B. To negatively charge nitride layer 40, contact C and the substrate are coupled to ground while contacts A and B are coupled to a positive programming voltage, $V_p$. Having contact B coupled to a positive voltage creates an inversion layer 55 below gate 36 in substrate 34. An inversion layer 56 is also generated below gate 38 in substrate 34 by gate 38.

Because of the close proximity (as described with respect to FIGS. 3 and 4) of gates 36 and 38, inversion layers 55 and 56 will be in contact. This contact between inversion layers 55 and 56 permits electrons 57 to travel from drain 35 through inversion layers 55 and 56. Electrons 57 will then traverse tunnel oxide 41 and become trapped in nitride layer 40. This results in nitride layer 40 having a net negative charge. After node A is returned to ground potential, the electrons trapped in nitride 40 will prevent the formation of inversion layer 56 and the accompanying depletion region in substrate 34. This lack of an inversion layer in substrate 34 means that conditional capacitor 53 of FIG. 5 is not generated and that node 50 is coupled only to ground 52. The lack of conditional capacitor 53 represents a logic 1 for cell 33 which will be discussed below.

Figure 6C:
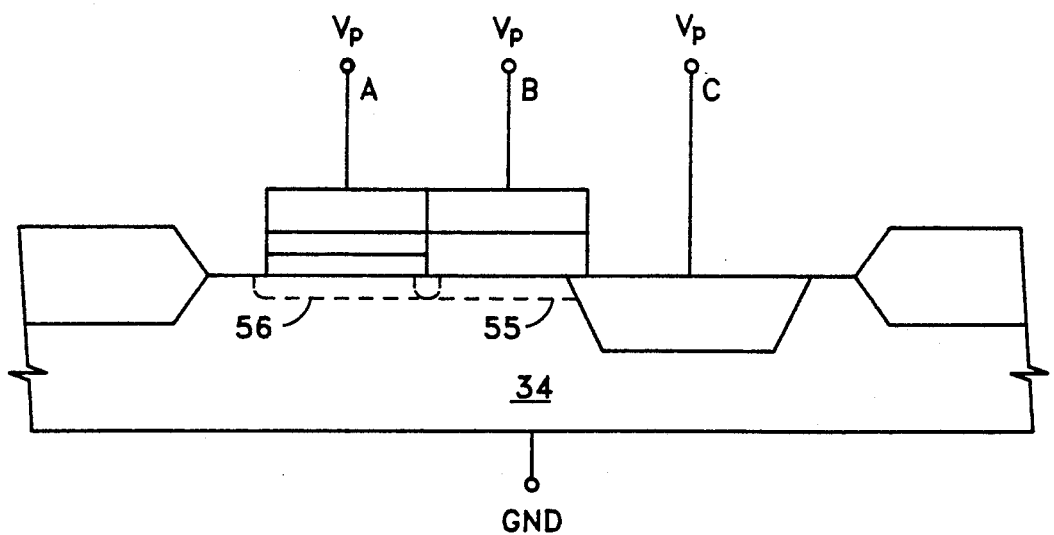
FIG. 6 is a cross-sectional view of the memory device of FIG. 3 illustrating a write inhibit operation.

A write inhibit operation (or writing of a logic 0) of cell 33 is illustrated in FIG. 6C. If contact C is connected to the programming voltage, Vp, instead of ground, the voltage of inversion layer 55 will be approximately the same as Vp. Therefor, the electric field across tunnel oxide 41 will be near zero and insufficient to cause electrons 57 to tunnel from inversion layer 55 to nitride layer 40. As a result of the lack of electron tunneling, no programming will occur.

Figure 7A:
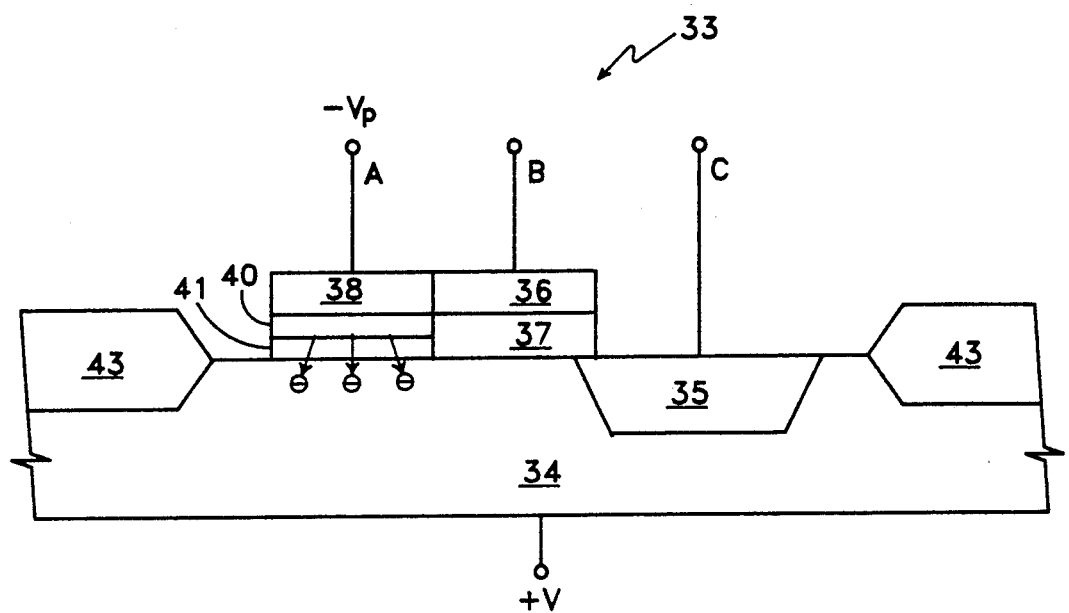
FIGS. 7A and 7B are cross-sectional views of the memory device of FIG. 3 illustrating an erase operation.
Figure 7B:
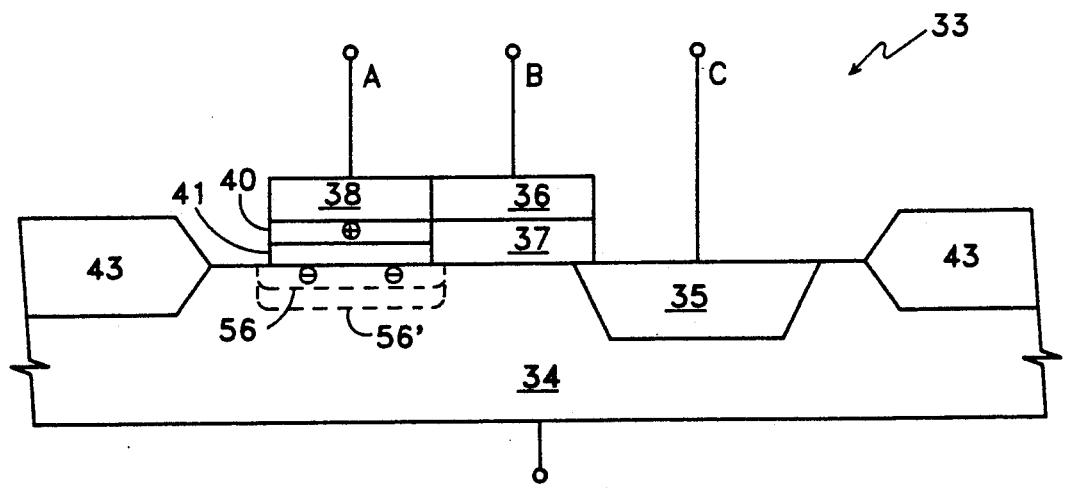

The erasing operation of cell 33 is illustrated in FIGS. 7A and 7B. To erase cell 33, the negative charge in nitride layer 40 must be removed. This removal is accomplished by coupling contact A to a reverse programming voltage, $-V_p$, while substrate 34 is coupled to a positive voltage. This causes the negative charge in nitride 40, represented by electrons 57, to be repelled into substrate 34 and possibly gate 36.

As shown in FIG. 7B, when gate 38 is returned to zero volts, nitride layer 40 will retain a net positive charge. This will generate an inversion layer 56 with an associated depletion region 56' in substrate 34 below gate 38. o Inversion layer 56, depletion region 56', and substrate 34 form a capacitance, conditional capacitor 53 of FIG. 5. Having capacitor 53 present represents a logic 0 for cell 33 as will be discussed below.

Figures 8A, 9A:
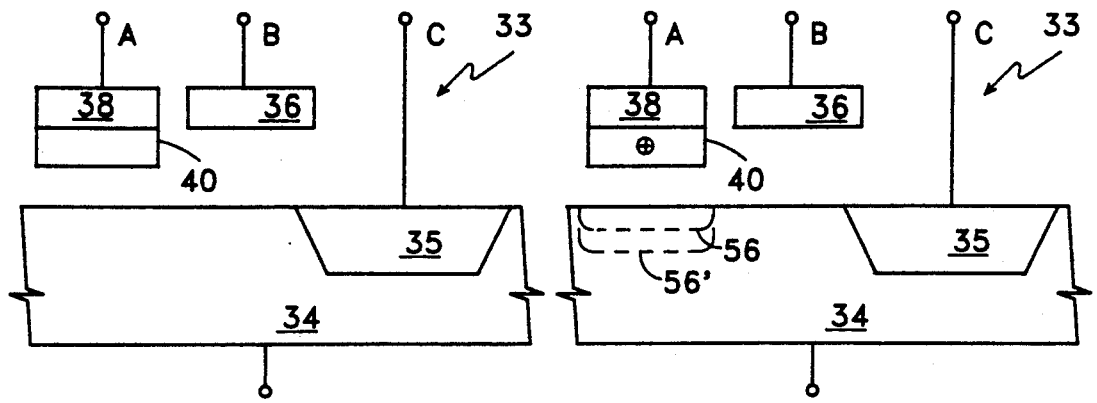
FIGS. 8A–8C are cross-sectional views of the memory device of FIG. 6B illustrating a read operation.
FIGS. 9A–9C are cross-sectional views of the memory device of FIG. 7B illustrating a read operation.

Referring now to FIGS. 8A–8D and 9A–9D, partial crosssectional views of cell 33 without (FIGS. 8A–8D) and with (FIGS. 9A–9D) inversion layer 56 and depletion region 56' are illustrated. In FIG. 8A, cell 33 is shown at equilibrium with a net negative charge on nitride layer 40. In FIG. 9A, cell 33 is shown at equilibrium with a net positive charge on nitride layer 40 and inversion layer 56 and depletion region 56'.

Figures 8B, 9B:
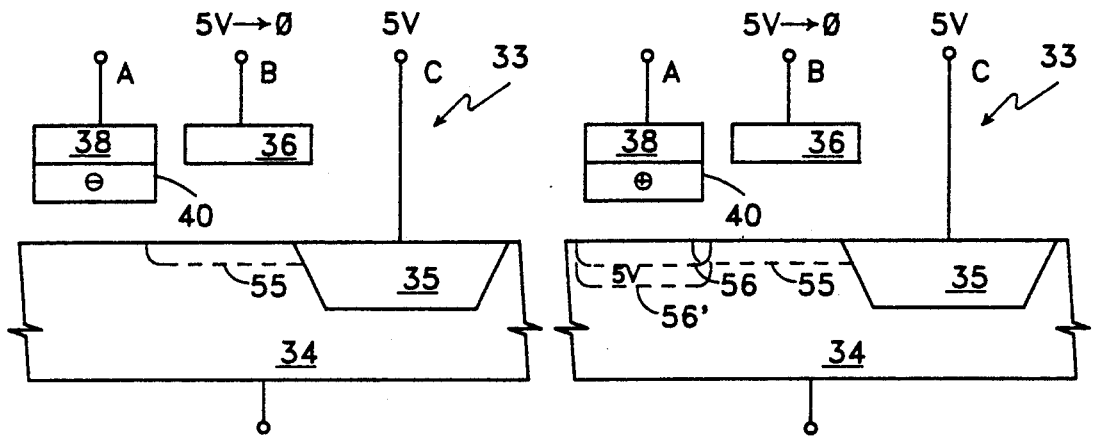
Figures 8C, 9C:
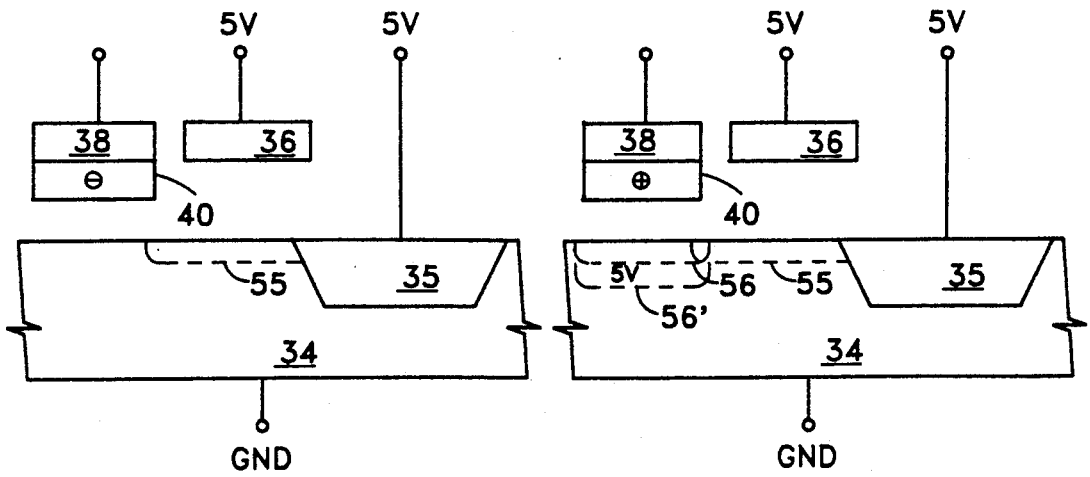

In order to read cell 33, a pre-read cycle must be completed. This pre-read cycle consists of setting contact C to 5 volts. While contact C is set to 5 volts, contact B is taken to 5 volts and then reduced to 0 volts. By placing the potential of contact B at 5V, inversion region 55 is generated in substrate 34. In FIG. 9B, inversion region 55 couples drain 35 to inversion region 56. This causes a 5 volt potential to be stored on capacitor 53, FIG. 5. In FIG. 8B, since there is no inversion layer 56, there is no capacitor to store the voltage and no change is caused in cell 33.

The next step in the process is the read step. To read cell 33, terminal C is set to a predetermined voltage, 5 volts in this example. Terminal B is then set to 5 volts to again generate inversion region 55. This enables the charge stored on the capacitor to be transferred to drain 35.

Figure 8D:
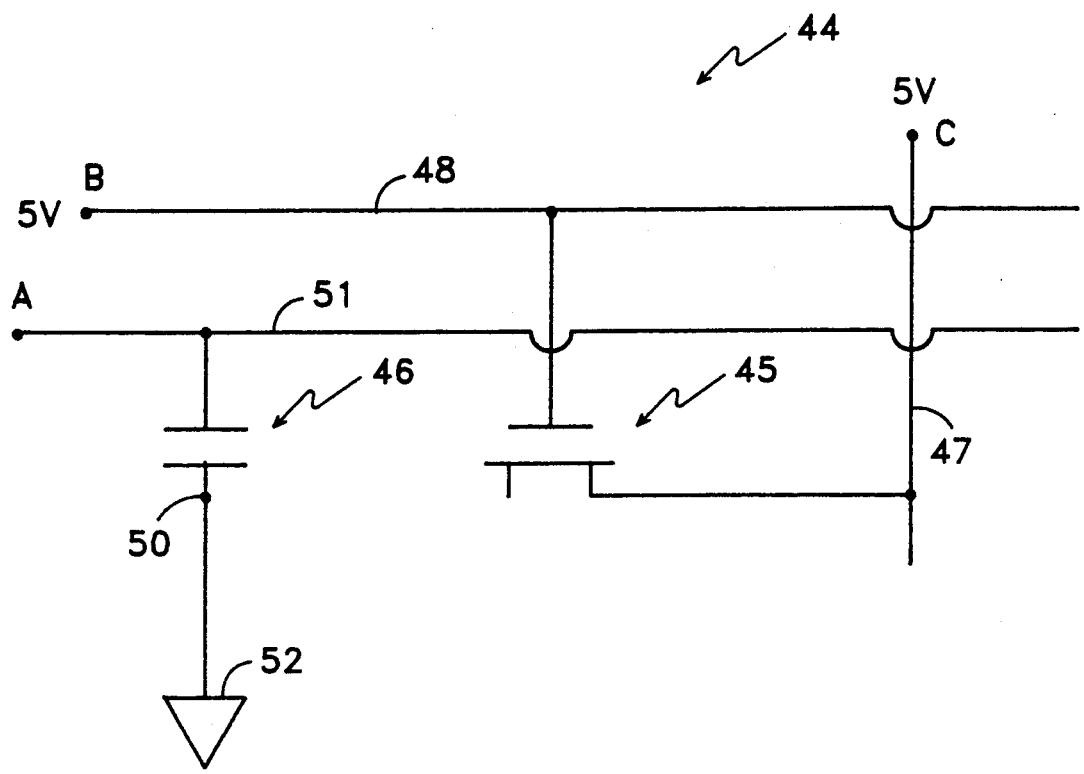
FIG. 8D is a schematic diagram of the equivalent circuit of the memory device of FIGS. 8A–8C.

As shown in FIG. 8D, since there is no inversion layer 56 or depletion region 56', there is no capacitor. There is also no connection between the source of transistor 45 and node 50. Therefore, there is no current flow through cell 33 to be sensed by a sensing amplifier. The sensing amplifier will then return a logic 1 for cell 33.

Figure 9D:
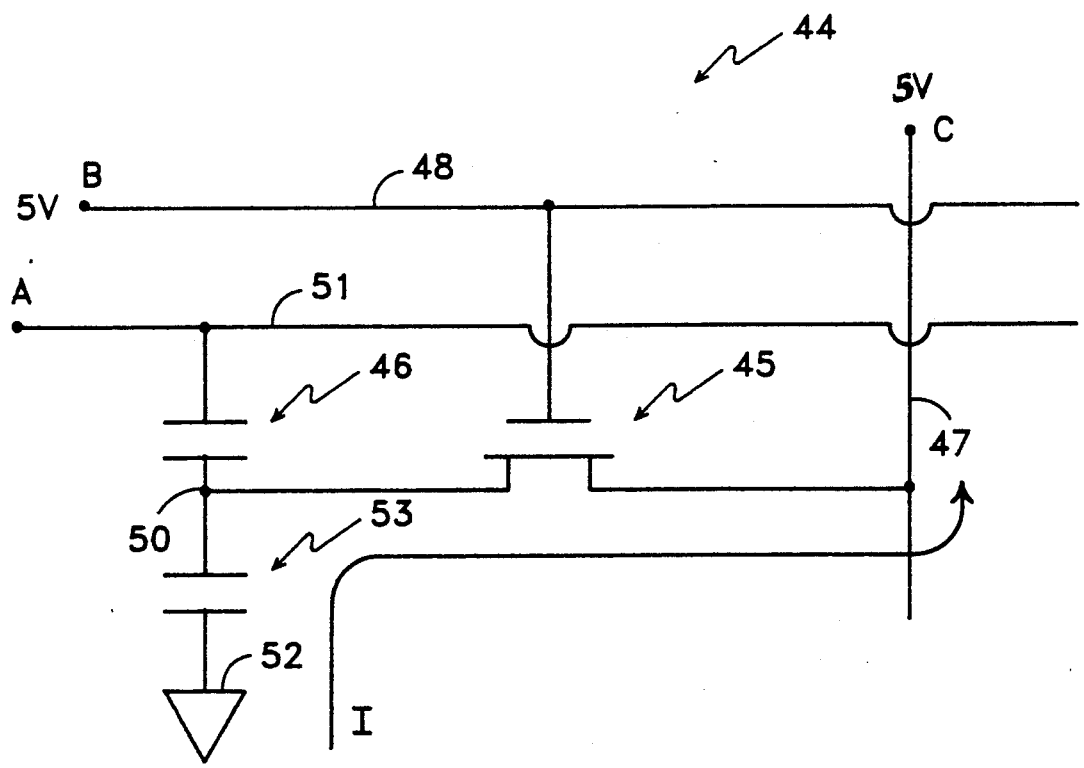
FIG. 9D is a schematic diagram of the equivalent circuit of the memory device of FIGS. 9A–9C.

When a capacitor is present, such as capacitor 53 of FIG. 9D, inversion region 55 will couple inversion layer 56 to drain 35. Inversion region 56 forms one plate of capacitor 53. As capacitor 53 has been charged to 5 volts in the pre-read cycle of this example, a pulse of current will flow through circuit 44 as shown. This current will be detected by a sensing amplifier and a logic "0" will be indicated for cell 33.

Therefore, the present invention provides a nonvolatile semiconductor memory cell which does not require a formed source or drain region and operates logically depending upon the presence or absence of a capacitance.

Figure 10:
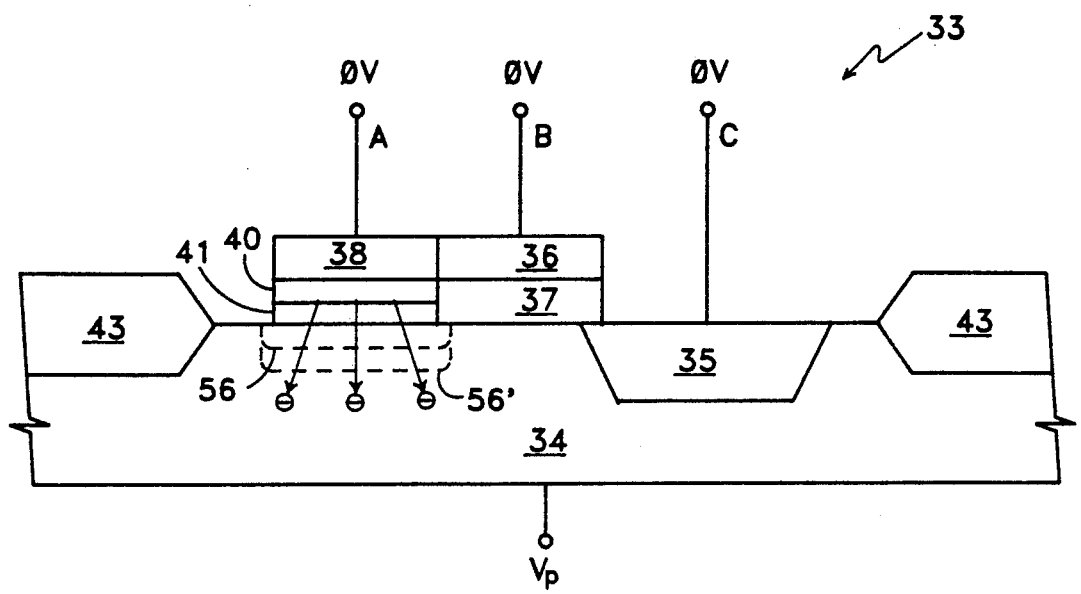
FIG. 10 is a cross-sectional view of the memory device of FIG. 3 being utilized as a dynamic random access memory.
Figure 11:
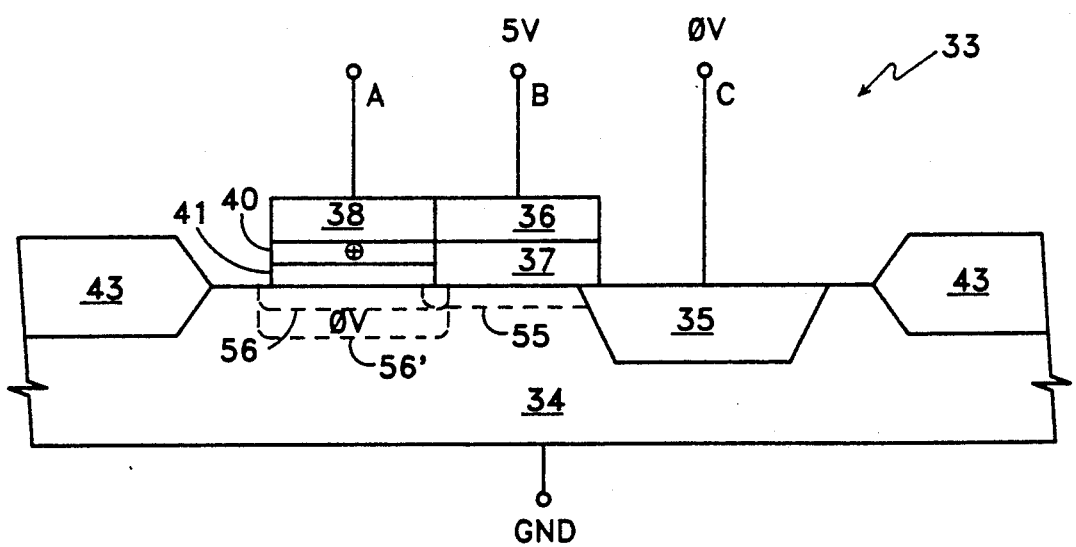
FIG. 11 is a cross-sectional view of the memory device of FIG. 10 illustrating the write operation.
Figure 12:
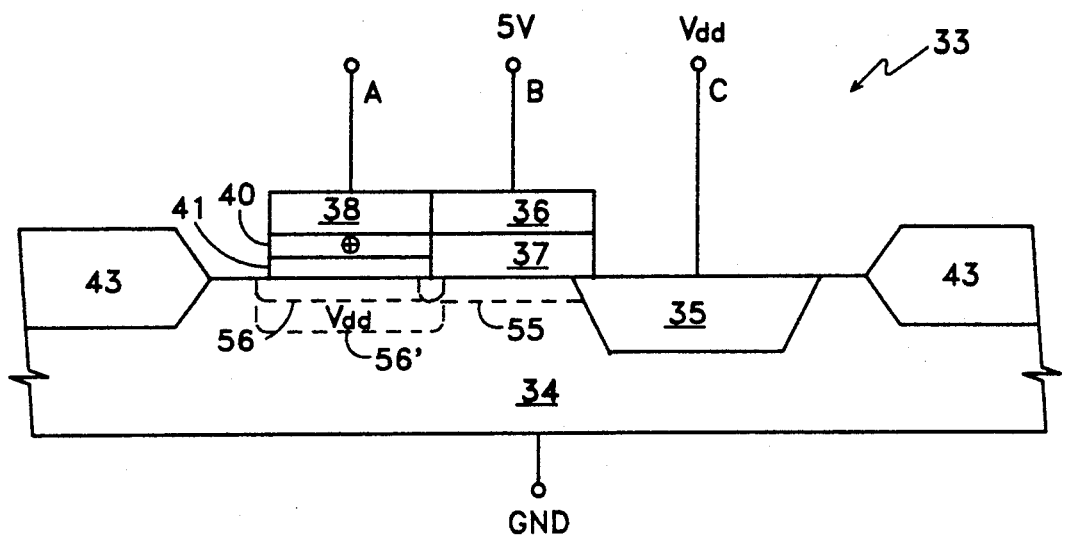
FIG. 12 is a cross-sectional view of the memory device of FIG. 10 illustrating a second write operation.

The present invention may also function as a dynamic random access memory. The DRAM function is illustrated in FIGS. 10-12. The process starts by creating a capacitor in all of the cells of the array. As shown in FIG. 10, substrate 34 is coupled to a positive programming voltage, $V_p$, while terminals A, B, and C are set to a reference voltage, such as 0 volts. If a negative charge exists in nitride layer 40, the action of setting substrate 34 to $V_p$ causes the negative charge to be drawn out of, or discharged from, nitride layer 40. If a positive charge exists in nitride layer 40, there will be little or no effect on nitride 40. In either case, the result is that nitride layer 40 is left with a net positive charge when terminal A is reset to zero volts. This net positive charge causes inversion layer 56 and depletion region 56' to be generated resulting in a capacitor consisting of inversion layer 56, depletion region 56', and substrate 34.

To write data into cell 33, terminal B is set to 5 volts; terminal A is held at a convenient voltage (which may be grounded); and terminal C is used as the data line. By setting terminal B to 5 volts, inversion layer 55 is created forming a link between inversion layer 56 and drain 35. If a logical data bit of 0 is to be stored, then line C is set to 0 volts, as shown in FIG. 11. Since inversion layer 56 is coupled to drain 35, the capacitor will be discharged leaving capacitor 53 with no charge.

If a logical data bit of 1 is to be stored, then line C is set to $V_{dd}$ (usually 5 volts), as shown in FIG. 12. Since inversion layer 56 is coupled to drain 35, the capacitor will be charged to $V_{dd}$.

In order to read the state of cell 33, the same procedure is followed as set forth in FIGS. 8A-8D and 9A-9D.

The present invention may also be utilized as a shadow RAM. A shadow RAM is a nonvolatile type of back-up to a volatile memory device. In this instance, both the nonvolatile and volatile devices are in the same cell. If the cell is being operated as a DRAM and the sense amplifiers are designed to drive line C to either 0 or $V_{dd}$ volts, then by raising terminals A and B to $V_p$ and raising $V_{dd}$ to $V_p$ the current contents of DRAM cell 33 can be written into nonvolatile storage. This is useful if a power outage or similar situation occurs.

The above examples of the present invention have been limited to SNOS devices having a p-type substrate and an n-type diffusion. It should be understood that the above cells would operate in the same manner, with opposite polarities, if they were comprised of an n-type substrate having a p-type diffusion.

Figure 13:
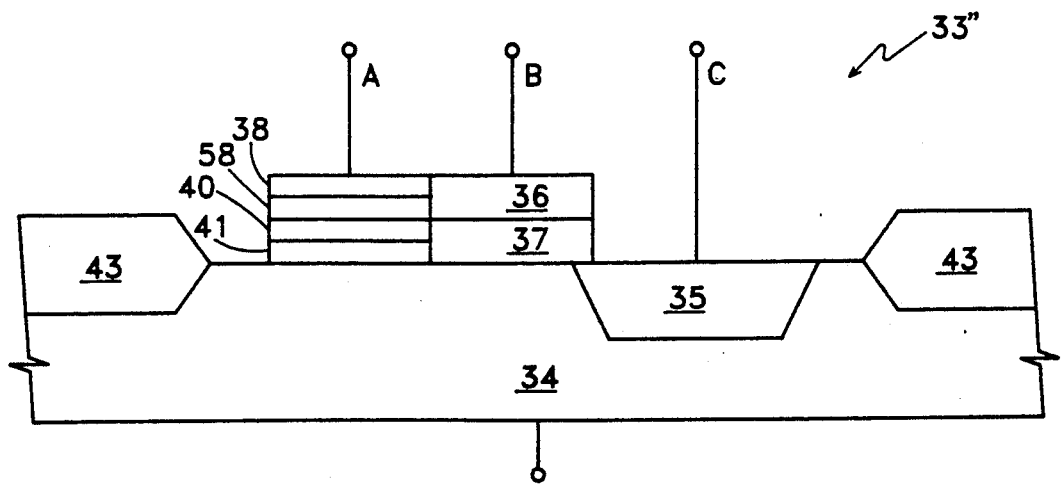
FIG. 13 is a cross-sectional view of a third embodiment of the present invention.

In FIG. 13, the present invention is illustrated in a SONOS configuration. A cell 33" is illustrated with the same configuration as cell 33 of FIG. 3, with the addition of an oxide layer 58 between memory gate 38 and nitride layer 40. Oxide layer 58 serves to prevent back injection from gate 38 to nitride layer 40.

Another modification of the present invention is to use a metal gate in place of polysilicon gate 38. This results in an MNOS (Metal-Nitride-Oxide-Silicon) cell. This configuration would have the same cross-sectional view as FIG. 3. An additional modification would produce an MONOS cell by disposing a layer of oxide between the metal and nitride layers.

Thus, it will be apparent to one skilled in the art, following a review of the above specification, that there has been provided in accordance with the invention, a device and method that fully satisfies the objects, aims, and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

I claim:

1. A nonvolatile semiconductor memory device comprising:
    a substrate of a first conductivity type;
    a region of a second conductivity type formed in a surface of said substrate;
    first gate means for generating an inversion layer in said substrate adjacent said region;
    first insulating means for insulating said first gate means from said substrate;
    second gate means for generating an inversion layer in said substrate contiguous with said inversion layer generated by said first gate means;
    charge retaining means for retaining a charge, said charge retaining means being disposed between said second gate means and said substrate; and
    second insulating means for insulating said charge retaining means from said substrate, said second insulating means selectively permitting transfer of a carrier.

2. The apparatus of claim 1 wherein said first conductivity type is a p-type conductivity and said second conductivity type is an n-type conductivity.

3. The apparatus of claim 1 wherein said first conductivity type is an n-type conductivity and said second conductivity type is a p-type conductivity.

4. The apparatus of claim 1 wherein said first and second gate means are polysilicon.

5. The apparatus of claim 1 wherein said second gate means is a metal.

6. The apparatus of claim 1 wherein said first and second insulating means are silicon dioxide.

7. The apparatus of claim 1 wherein said charge retaining means is silicon nitride.

8. The apparatus of claim 1 further comprising third insulating means for insulating said charge retaining means from said second gate means.

9. A nonvolatile semiconductor memory device comprising:
    a substrate of a first conductivity type;

a region of a second conductivity type formed in a surface of said substrate;

a first gate being disposed above a portion of said substrate adjacent to said region and generating an inversion layer therein;

a first oxide layer being disposed between said surface of said substrate and said first gate;

a second gate being disposed contiguous to said first gate to generate an inversion layer in said substrate substantially contiguous with the inversion layer generated by the first gate;

a second oxide layer being disposed between said substrate and said second gate; and nitride layer for retaining electrical charge disposed between said second oxide layer and said second gate.

10. The apparatus of claim wherein said first conductivity type is a p-type conductivity and said second conductivity type is an n-type conductivity.

11. The apparatus of claim 9 wherein said first conductivity type is an n-type conductivity and said second conductivity type is a p-type conductivity.

12. The apparatus of claim 9 wherein said first and second gates are polysilicon.

13. The apparatus of claim 9 wherein said second gate is a metal.

14. The apparatus of claim 9 wherein said first and second oxide layers are silicon dioxide.

15. The apparatus of claim 9 wherein said nitride layer is silicon nitride.

16. The apparatus of claim 9 further comprising a third oxide layer disposed between said nitride layer and said second gate.

17. A silicon-nitride-oxide-silicon-type nonvolatile memory cell, comprising a silicon substrate having a drain region therein extending to a major surface of said substrate, an oxide layer overlying and in contact with a portion of said major surface of said substrate substantially up to a boundary with said drain region, a nitride layer having an edge substantially parallel to said boundary and overlying and in contact with a portion of said oxide layer, said nitride layer capable of storing an electrical charge therein, gate means directly overlying said nitride layer and overlying and in contact with said oxide layer other than said portion thereof, said portion of said oxide layer underlying said nitride layer being substantially thinner than the remainder of said oxide layer to allow electron tunneling through said thinner portion between said substrate and said nitride layer, and bias means coupled to said gate means and said drain region for controllably changing the polarity of the total electrical charge on the nitride layer to selectively induce or not induce a capacitance between said substrate and an inversion layer created or not created in the surface of said substrate beneath said gate means according to said polarity of electrical charge on the nitride layer, whereby to enable storing information in said cell as the presence or absence of said capacitance.

18. The invention of claim 10, wherein said gate means includes a first electrically conductive gate layer overlying and in contact with said nitride layer, a second electrically conductive gate layer overlying and in contact with said oxide layer other than said portion thereof, said first and second electrically conductive gates electrically isolated from one another, and having an edge substantially adjoining an edge of the other which is substantially parallel to said boundary, whereby to create substantially contiguous inversion layers in said major surface of said substrate beneath said first and second gate layers according to said polarity of electrical charge on said nitride layer.

19. The invention according to claim 18, wherein said bias means includes a first contact electrically connected to said first gate layer, a second contact electrically connected to said second gate layer, a third contact electrically connected to said drain region, a fourth contact electrically connected to said substrate, and said contacts being arranged and adapted for respective connection of supply potentials thereto according to the desired said polarity of electrical charge on said nitride layer.

* * * * *